(12) United States Patent
Han et al.

(10) Patent No.: US 9,478,310 B2
(45) Date of Patent: Oct. 25, 2016

(54) SHIFT REGISTER UNIT, GATE DRIVING CIRCUIT AND METHOD, DISPLAY APPARATUS

(71) Applicant: BOE TECHNOLOGY GROUP CO., LTD., Beijing (CN)

(72) Inventors: Seung Woo Han, Beijing (CN); Yuanbo Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/428,919

(22) PCT Filed: Jul. 3, 2014

(86) PCT No.: PCT/CN2014/081572
§ 371 (c)(1),
(2) Date: Mar. 17, 2015

(87) PCT Pub. No.: WO2015/109769
PCT Pub. Date: Jul. 30, 2015

(65) Prior Publication Data
US 2016/0012911 A1    Jan. 14, 2016

(30) Foreign Application Priority Data
Jan. 27, 2014 (CN) .......................... 2014 1 0040299

(51) Int. Cl.
*G11C 19/00* (2006.01)
*G11C 19/28* (2006.01)
*G09G 3/20* (2006.01)

(52) U.S. Cl.
CPC ................. *G11C 19/28* (2013.01); *G09G 3/20* (2013.01); *G09G 3/2096* (2013.01); *G09G 2300/0871* (2013.01); *G09G 2310/0267* (2013.01); *G09G 2310/0286* (2013.01)

(58) Field of Classification Search
CPC ....... G09G 3/20; G09G 3/2096; G11C 19/28
USPC .......... 377/64, 68, 70, 71–74, 75, 77, 80, 54
See application file for complete search history.

(56) References Cited

U.S. PATENT DOCUMENTS

| 6,970,530 B1 | 11/2005 | Wang et al. | |
|---|---|---|---|
| 2002/0044625 A1* | 4/2002 | Kim | G11C 19/184 377/54 |

(Continued)

FOREIGN PATENT DOCUMENTS

| CN | 102637401 A | 8/2012 |
|---|---|---|
| CN | 102651186 A | 8/2012 |

(Continued)

OTHER PUBLICATIONS

Oct. 8, 2014—(CN) International Search Report for PCT/CN2014/081572.

(Continued)

*Primary Examiner* — Lincoln Donovan
*Assistant Examiner* — Thomas Skibinski
(74) *Attorney, Agent, or Firm* — Banner & Witcoff, Ltd.

(57) ABSTRACT

Provided is a shift register unit, a gate driving circuit and method, and a display apparatus. The shift register unit comprises an input module, a pulling-up module, a first control module, a second control module, a first reset module and a pulling-down module. It can be avoided that a relative large drift occurs in a threshold voltage of a pulling-down TFT (T8) by controlling a voltage at the pulling-down control node (PD) of the shift register unit, thus effectively increasing reliability of the shift register unit in operation.

15 Claims, 4 Drawing Sheets

(56) References Cited

U.S. PATENT DOCUMENTS

| | | | |
|---|---|---|---|
| 2006/0227093 A1* | 10/2006 | Jang | G09G 3/20 345/100 |
| 2011/0044423 A1 | 2/2011 | Lin et al. | |
| 2013/0028370 A1* | 1/2013 | Kikuchi | G09G 3/3677 377/64 |

FOREIGN PATENT DOCUMENTS

| | | | | |
|---|---|---|---|---|
| CN | 102654969 A | 9/2012 | | |
| CN | 102945650 A | 2/2013 | | |
| CN | 102956213 A | 3/2013 | | |
| CN | 103236273 A | 8/2013 | | |
| CN | 103474044 A | 12/2013 | | |
| CN | 103761937 A | 4/2014 | | |
| WO | WO 2011148655 A1 * | 12/2011 | | G09G 3/3677 |

OTHER PUBLICATIONS

Oct. 8, 2014—(CN) Written Opinion for PCT/CN2014/081572—Eng Tran.

Sep. 17, 2015—(CN)—First Office Action Appn 201410040299.3 with Eng Tran.

Mar. 8, 2016—(CN)—Second Office Action Appn 201410040299.3 with English Tran.

* cited by examiner

SHIFT REGISTER UNIT, GATE DRIVING CIRCUIT AND METHOD, DISPLAY APPARATUS The application is a U.S. National Phase Entry of International Application No. PCT/CN2014/081572 filed on Jul. 3, 2014, designating the United States of America and claiming priority to Chinese Patent Application No. 201410040299.3 filed on Jan. 27, 2014. The present application claims priority to and the benefit of the above-identified applications and the above-identified applications are incorporated by reference herein in their entirety.

TECHNICAL FIELD OF THE DISCLOSURE

The present disclosure relates to a field of display technology, and particularly to a shift register unit, a gate driving circuit and method, and a display apparatus.

BACKGROUND

Generally, during a period in which signal outputted from an output terminal of a shift register unit is at a low level, the signal outputted from the output terminal of the shift register unit is subject to be disturbed by an input clock signal and thus noise is generated in the signal. In order to suppress noise, the shift register unit generally comprises a pulling-down thin film transistor (TFT) for pulling down the signal outputted from the output terminal. A pulling-down control node is connected to a gate of the pulling-down TFT, and is configured to control to turn on the pulling-down TFT, so as to pull down a level of a gate driving signal at the output terminal.

Known shift register units at least have the following problems: generally, most of the time, the pulling-down control node connected to the gate of the pulling-down TFT is kept to be at a high level and thus the pulling-down TFT is kept to be turned on, resulting in an occurrence of a relative large drift in a threshold voltage of the pulling-down TFT. The pulling-down TFT could not be turned on if the threshold voltage of the pulling-down TFT is increased continuously, such that a function of noise suppression cannot be achieved and performance of a whole shift register is deteriorated.

SUMMARY

In embodiments of the present disclosure, there are provided a shift register unit, a gate driving circuit and a display apparatus capable of controlling a level at a pulling-down control node of the shifter resister unit and avoiding that a relative large drift is generated in a threshold voltage of a pulling-down TFT, thus ensuring reliability of a shift register.

In accordance with one aspect of the present disclosure, there is provided a shift register unit comprising an input module, a pulling-up module, a first control module, a second control module, a first reset module and a pulling-down module; wherein the input module is configured to control a level at a pulling-up control node according to a signal inputted from a first signal terminal; the pulling-up module is configured to control to output a third level signal at an output terminal according to a signal inputted from a first clock signal terminal and the level at the pulling-up control node; the first control module is configured to control a level at a pulling-down control node according to a signal inputted from a third clock signal terminal and the level at the pulling-up control node; the second control module is configured to control the level at the pulling-down control node according to the signal inputted from the first clock signal terminal; the first reset module is configured to reset the level at the pulling-up control node according to the level at the pulling-down control node; and the pulling-down module is configured to control to output a first level signal at the output terminal according to a signal inputted from a second signal terminal.

Optionally, there is a time delay equal to half of a clock signal cycle between the signal inputted from the first clock signal terminal and the signal inputted from the third clock signal terminal.

Optionally, the shift register unit further comprises a second reset module which is configured to reset the level at the pulling-up control node according to the signal inputted from the second terminal.

Optionally, the first control module is further configured to control the level at the pulling-down control node according to the signal inputted from the first signal terminal Optionally, the input module comprises a first TFT having a first electrode and a second electrode connected to the first signal terminal and a third electrode connected to the pulling-up control node.

Optionally, the pulling-up module comprises a third TFT and a first capacitor, the third TFT has a first electrode connected to the first clock signal terminal, a second electrode connected to the pulling-up control node, and a third electrode connected to the output terminal; the first capacitor has a first terminal connected to the pulling-up control node and a second terminal connected to the output terminal.

Optionally, the first control module comprises a fifth TFT and a sixth TFT, the fifth TFT has a first electrode and a second electrode connected to the third clock signal terminal and a third electrode connected to the pulling-down control node; the sixth TFT has a first electrode connected to the pulling-down control node, a second electrode connected to the pulling-up control node, and a third electrode connected to a first voltage terminal.

Optionally, the second control module comprises a ninth TFT having a first electrode connected to the pulling-down control node, a second electrode connected to the first clock signal terminal, and a third electrode connected to the first voltage terminal.

Optionally, the first control module further comprises a seventh TFT having a first electrode connected to the pulling-down control node, a second electrode connected to the first signal terminal, and a third electrode connected to the first voltage terminal.

Optionally, the first reset module comprises an eighth TFT having a first electrode connected to the pulling-up control node, a second electrode connected to the pulling-down control node, and a third electrode connected to the first voltage terminal.

Optionally, the second reset module comprises a second TFT having a first electrode connected to the pulling-up control node, a second electrode connected to the second signal terminal, and a third electrode connected to the first voltage terminal.

Optionally, the pulling-down module comprises a fourth TFT having a first electrode connected to the output terminal, a second electrode connected to the second signal terminal, and a third electrode connected to the first voltage terminal.

In accordance with another aspect of the present disclosure, there is further provided a gate driving circuit comprising a plurality of stages of shift register units described above in cascade, wherein the first clock signal terminal and the third clock signal terminal of an odd-numbered stage of shift register unit are connected to a first clock signal and a third clock signal respectively, and the first clock signal terminal and the third clock signal terminal of an even-numbered stage of shift register unit are connected to a second clock signal and a fourth clock signal respectively; the first clock signal, the second clock signal, the third clock signal and the fourth clock signal are shift signals outputted sequentially, and there is a time delay equal to half of a clock signal cycle between the first clock signal and the third clock signal and between the second clock signal and the fourth clock signal.

In accordance with another aspect of the present disclosure, there is further provided a driving method of the gate driving circuit, wherein during a first phase, the level at the pulling-down control node is controlled by the signal inputted from the third clock signal terminal and the level at the pulling-up control node; and during a second phase, the level at the pulling-down control node is controlled by the signal inputted from the first clock signal terminal.

In accordance with another aspect of the present disclosure, there is further provided a display apparatus comprising the gate driving circuit described above.

In the shift register unit, the gate driving circuit and method and the display apparatus proposed in the embodiments of the present disclosure, the shift register unit comprises the input module, the pulling-up module, the first control module, the second control module, the first reset module, and the pulling-down module; the level at the pulling-down control node of the shifter resister unit is controlled, such that it can be avoided that a relative large drift is generated in the threshold voltage of the pulling-down TFT (the gate of which is connected to the pulling-down control node), and thus reliability of a shift register can be ensured.

BRIEF DESCRIPTION OF THE DRAWINGS

In order to more clearly describe the technical solutions of the embodiments of the present disclosure or the prior art, drawings necessary for describing the embodiments of the present disclosure or the prior art are simply introduced as follows. It should be obvious for those skilled in the art that the drawings described as follows are only some embodiments of the present disclosure, and other accompanying drawings can be easily obtained by those skilled in the art based on the accompanying drawings without paying any inventive labor.

DETAILED DESCRIPTION

Hereinafter, the technical solutions in the embodiments of the present disclosure will be described clearly and thoroughly with reference to the accompanying drawings of the embodiments of the present disclosure. Obviously, the embodiments as described are only some of the embodiments of the present disclosure, and are not all of the embodiments of the present disclosure. Other embodiments obtained by those skilled in the art based on the embodiments of the present disclosure without paying inventive labor shall belong to the scope sought for protection in the present disclosure.

Sources and drains of TFTs adopted in the embodiments of the present disclosure are interchangeable in terms of names since the sources and the drains are symmetric in structure. In addition, each of TFTs may be classified as a P type transistor or an N type transistor according to characteristics of the TFT. In the embodiments of the present disclosure, for an N type transistor, a first electrode may be a source, a second electrode may be a gate, and a third electrode may be a drain. Each of TFTs adopted in the embodiments of the present disclosure may be an N type transistor or a P type transistor. In the following embodiments, an illustration will be given by taking TFTs which are N type transistors as an example. It should be clear that the timing sequence of the driving signals should be adjusted accordingly when P type transistors are adopted.

Figure 1:
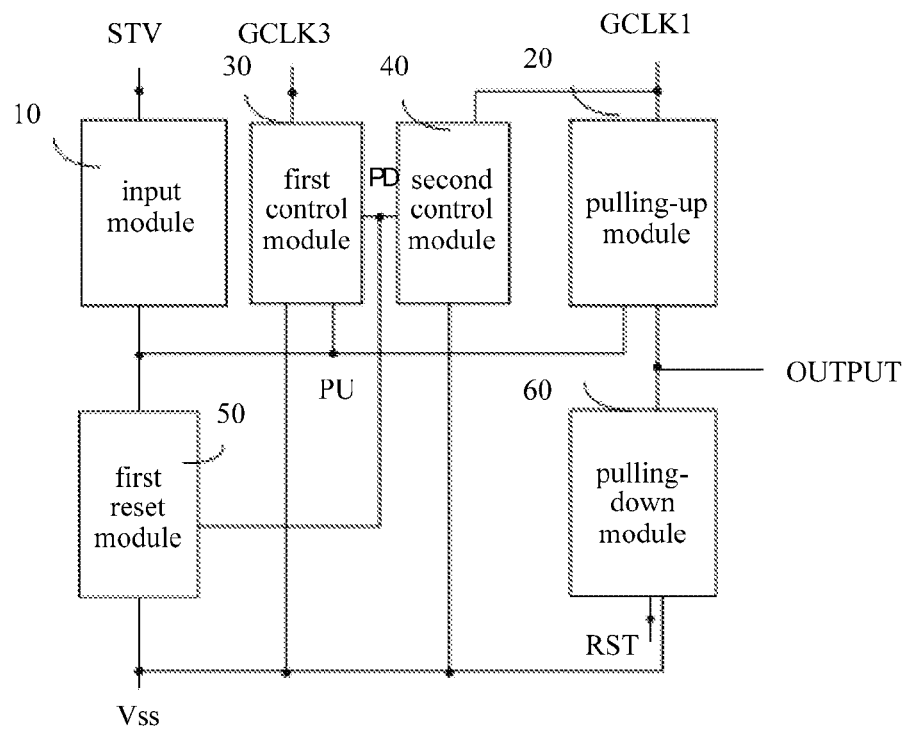
FIG. 1 is a first schematic diagram of module connection structure of a shift register unit provided in the embodiments of the present disclosure.

As illustrated in FIG. 1, a shift register unit provided in the embodiment of the present disclosure comprises an input module 10, a pulling-up module 20, a first control module 30, a second control module 40, a first reset module 50 and a pulling-down module 60.

The input module 10 is configured to control a level at a pulling-up control node PU which is a connection point between the input module 10 and the pulling-up module 20 according to a signal inputted from a first signal terminal STV. The input module 10 has a first terminal connected to the first signal terminal STV and a second terminal connected to the pulling-up control node PU. For example, when the signal inputted from the first signal terminal STV is at a high level, a level at the pulling-up control node PU is pulled up to a high level. The signal inputted from the first signal terminal STV may also be a first clock signal.

The pulling-up module 20 is configured to control to output a third level signal at an output terminal OUTPUT according to a signal inputted from a first clock signal terminal GCLK1 and the level at the pulling-up control node PU. That is, the pulling-up module 20 outputs the signal inputted from the first clock signal terminal GCLK1 in response to the level at the pulling-up control node PU, and the third level signal is the signal inputted from the first clock signal terminal GCLK1 at this time. The pulling-up module 20 has a first terminal connected to the first clock signal terminal GCLK1, a second terminal connected to the pulling-up control node PU, and a third terminal connected to the output terminal OUTPUT. The third level signal is at a high level when N type TFTs are adopted in the pulling-up module.

The first control module 30 is configured to control a level at a pulling-down control node PD which is a connection point between the first control module 30 and the second control module 40 according to a signal inputted from a third clock signal terminal GCLK3 and the level at the pulling-up control node PU. The first control module 30 has a first terminal connected to the third clock signal terminal GCLK3, a second terminal connected to the pulling-up control node PU, a third terminal connected to a first voltage terminal VSS, and a fourth terminal connected to the pulling-down control node PD. The first voltage terminal VSS supplies a first level signal.

The second control module 40 is configured to control the level at the pulling-down control node PD according to the signal inputted from the first clock signal terminal GCLK1. The second control module 40 has a first terminal connected to the pulling-down control node PD, a second terminal connected to the first clock signal terminal GCLK1, and a third terminal connected to the first voltage terminal VSS. For example, the second control module 40 pulls down the level at the pulling-down control node PD to a low level when the signal at GCLK1 is at a high level.

The first reset module 50 is configured to reset the level at the pulling-up control node PU according to the level at the pulling-down control node PD. The first reset module 50 has a first terminal connected to the pulling-up control node PU, a second terminal connected to the pulling-down control node PD, and a third terminal connected to the first voltage terminal VSS. Here, the third terminal of the first reset module 50 may be connected in various manners and is not limited to be connected to the first voltage terminal VSS. For example, the third terminal of the first reset module 50 can be connected to a ground line or a second voltage terminal which supplies a second level signal. The first level signal supplied by the first voltage terminal VSS and the second level signal supplied by the second voltage terminal may have different levels, but should be low level signals when N type TFTs are adopted.

The pulling-down module 60 is configured to control to output the first level signal at the output terminal OUTPUT according to a signal inputted from a second signal terminal. The pulling-down module 60 has a first terminal connected to the output terminal OUTPUT, a second terminal connected to the second signal terminal RST, and a third terminal connected to the first voltage terminal VSS. Here, the second signal terminal RST at a present stage may be connected to one of the following: a signal at the output terminal of a shift register unit at a stage immediate subsequent thereto or at a two-stage subsequent thereto, a signal having a phase opposite to the signal at the first clock signal terminal, a signal at the pulling-down control node, and even a RST signal supplied separately. In addition, the third terminal of the pulling-down module 60 can be connected to a ground line or a second voltage terminal which supplies a second level signal. The first level signal supplied by the first voltage terminal VSS and the second level signal supplied by the second voltage terminal may have different levels, but should be low level signals when N type TFTs are adopted.

The shift register unit provided in the embodiments of the present disclosure comprises the input module, the pulling-up module, the first control module, the second control module, the first reset module, and the pulling-down module, which can avoid that a relative large drift is generated in the threshold voltage of the pulling-down TFT (the gate of which is connected to the pulling-down control node) by controlling the level at the pulling-down control node of the shifter resister unit, and thus can ensure the reliability of a shift register unit.

In one example, the signal inputted from the first clock signal terminal GCLK1 and the signal inputted from the third clock signal terminal GCLK3 have a same clock signal cycle, and there is a time delay equal to half of the clock signal cycle between the signal inputted from the first clock signal terminal GCLK1 and the signal inputted from the third clock signal terminal GCLK3. Here, the signal inputted from the first clock signal terminal GCLK1 and the signal inputted from the third clock signal terminal GCLK3 may have a duty ratio of ¼ in a clock signal cycle.

Figure 2:
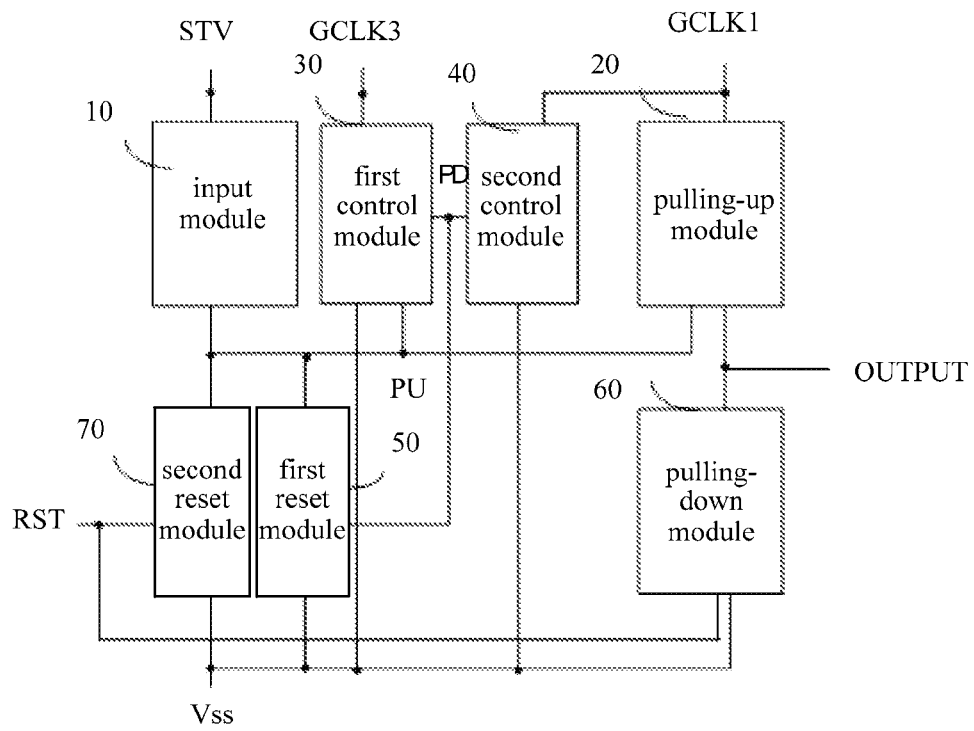
FIG. 2 is a second schematic diagram of module connection structure of a shift register unit provided in the embodiments of the present disclosure.

In another embodiment, as illustrated in FIG. 2, the shift register unit further comprises a second reset module 70 which is configured to reset the level at the pulling-up control node PU. The second reset module 70 has a first terminal connected to the pulling-up control node PU, a second terminal connected to the second signal terminal RST, a third terminal connected to the first voltage terminal VSS. Of course, the signal inputted at the second signal terminal RST of the second reset module 70 may be one of the followings: a signal at the output terminal of a shift register unit at a subsequent stage, a signal having a phase opposite to the signal at the first clock signal terminal, a signal at the pulling-down control node, and even a RST signal supplied separately. In addition, the third terminal of the second reset module 70 can be connected to a second voltage terminal. The level supplied by the first voltage terminal and the second level supplied by the second voltage terminal may have different levels, but should be low level signals when N type TFTs are adopted.

Figure 3:
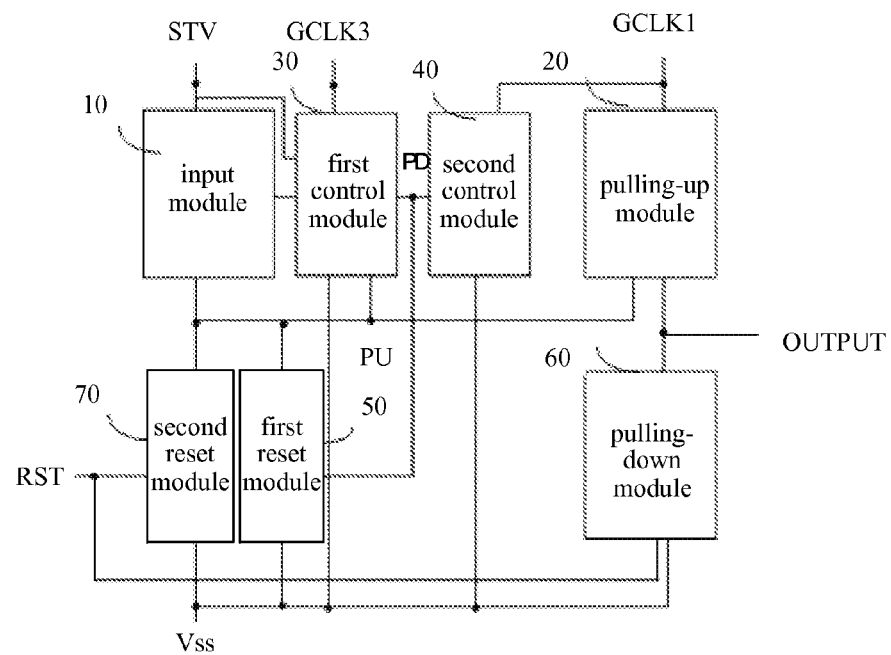
FIG. 3 is a third schematic diagram of module connection structure of a shift register unit provided in the embodiments of the present disclosure.

In another embodiment of the present disclosure, as illustrated in FIG. 3, the first control module 30 is further configured to control the level at the pulling-down control node PD according to the signal inputted from the first signal terminal STV. Here, the fourth terminal of the first control module can be connected to the first signal terminal STV.

Figure 4:
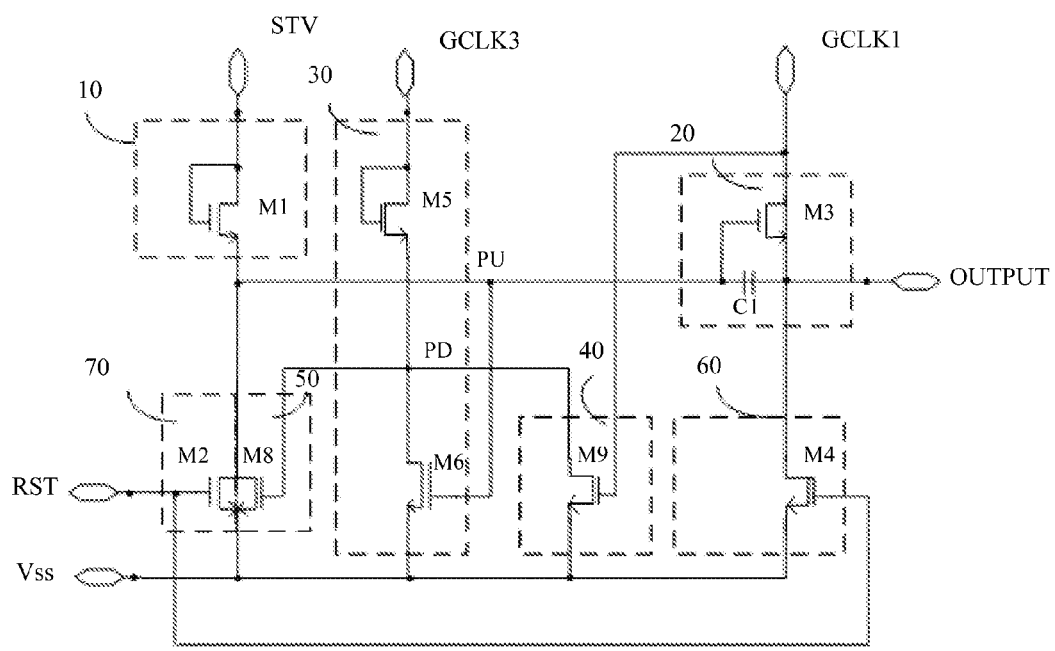
FIG. 4 is a first schematic diagram of circuit connection structure of a shift register unit provided in the embodiments of the present disclosure.

In one example, as illustrated in FIG. 4, the input module 10 can comprise a first TFT M1 having a first electrode and a second electrode connected to the first signal terminal STV and a third electrode connected to the pulling-up control node PU.

Additionally or alternatively, the input module 10 can comprise an eleventh TFT M11 (not illustrated) having a first electrode connected to the first signal terminal STV, a second electrode connected to a fifth clock signal output terminal, and a third electrode connected to the pulling-up control node PU. Here, the signal at the fifth clock signal output terminal may be synchronized with STV, or has a time delay equal to one-fourth clock signal cycle relative to the first clock signal.

In one example, the pulling-up module 20 comprises a third TFT M3 and a first capacitor C1.

The third TFT M3 has a first electrode connected to the first clock signal terminal GCLK1, a second electrode connected to the pulling-up control node PU, and a third electrode connected to the output terminal OUTPUT.

The first capacitor C1 has a first terminal connected to the pulling-up control node PU and a second terminal connected to the output terminal OUTPUT.

In one example, the first control module 30 comprises a fifth TFT M5 and a sixth TFT M6.

The fifth TFT M5 has a first electrode and a second electrode connected to the third clock signal terminal GCLK3 and a third electrode connected to the pulling-down control node PD.

The sixth TFT M6 has a first electrode connected to the pulling-down control node PD, a second electrode connected to the pulling-up control node PU, and a third electrode connected to the first voltage terminal VSS.

In one example, the second control module 40 comprises a ninth TFT M9 having a first electrode connected to the pulling-down control node PD, a second electrode connected to the first clock signal terminal GCLK1, and a third electrode connected to the first voltage terminal VSS.

It should be noted that the second control module 40 may comprise a plurality of transistors each of which is connected in a same manner as the ninth TFT M9. Here, illustration will be given by taking the case that the second control module comprises only one ninth TFT M9 as illustrated in the FIG. 4 as an example, and other second control modules with other structures should belong to the protection scope of the present disclosure although the detailed description thereof is omitted.

In the embodiments of the present disclosure, the second control module 40 is configured to pull down the level at the pulling-down control node PD when the first clock signal terminal GCLK1 outputs a high level signal, thus reducing the duty ratio of the voltage at the pulling-down control node PD, avoiding a drift of a threshold voltage of an eighth TFT M8 (i.e., pulling-down TFT) connected to the pulling-down control node PD, and ensuring the reliability of the shift register unit.

Figure 5:
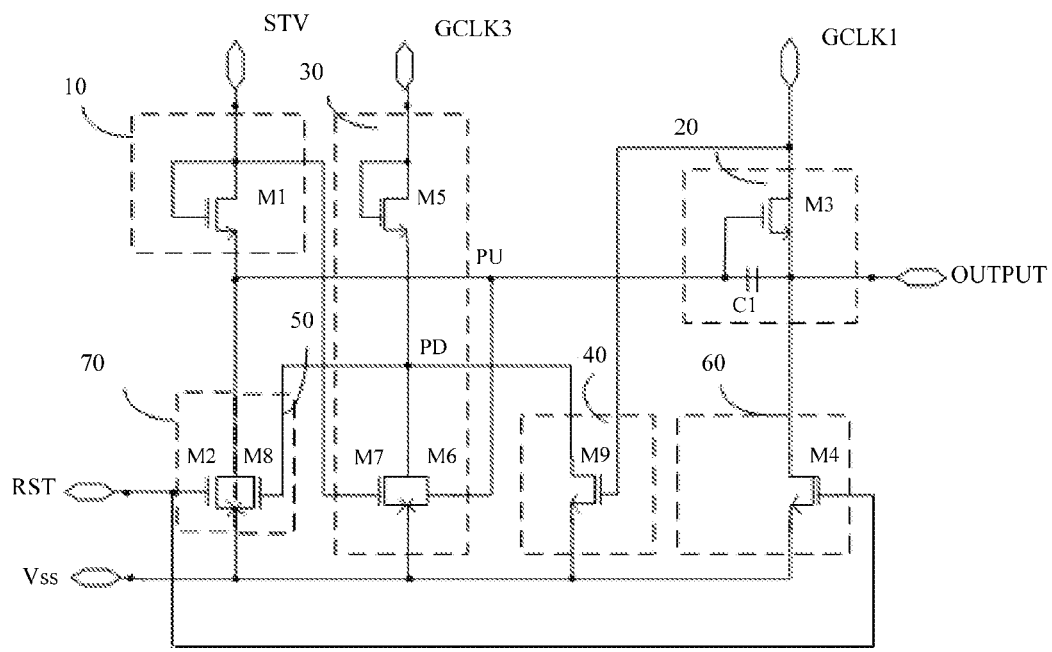
FIG. 5 is a second schematic diagram of circuit connection structure of a shift register unit provided in the embodiments of the present disclosure.

In another embodiment, as illustrated in FIG. 5, the first control module 30 further comprises a seventh TFT M7 having a first electrode connected to the pulling-down control node PD, a second electrode connected to the first signal terminal STV, and a third electrode connected to the first voltage terminal VSS.

In one example, the first reset module 50 further comprises the eighth TFT M8 having a first electrode connected to the pulling-up control node PU, a second electrode connected to the pulling-down control node PD, and a third electrode connected to the first voltage terminal VSS.

In one example, the second reset module 70 comprises a second TFT M2 having a first electrode connected to the pulling-up control node PU, a second electrode connected to the second signal terminal RST, and a third electrode connected to the first voltage terminal VSS.

In one example, the pulling-down module 60 comprises a fourth TFT M4 having a first electrode connected to the output terminal OUTPUT, a second electrode connected to the second signal terminal RST, and a third electrode connected to the first voltage terminal VSS. Here, the signal inputted to the second electrode of the fourth TFT M4 is not limited to the signal at the second signal terminal RST, but may be a signal having a phase opposite to the signal at the first clock signal terminal GCLK1, and may be a signal at the pulling-down control node PD.

Below, an operational process of the shift register unit will be described in detail by taking the structure illustrated in FIG. 5 as an example and combining with the timing sequence of the signals in the shift register unit illustrated in FIG. 6.

During a T1 phase, GCLK1=0, GCLK3=0, STV=1, OUTPUT=0, RST=0, PU=1, PD=0.

The T1 phase is a charging phase of the shift register unit.

Figure 6:
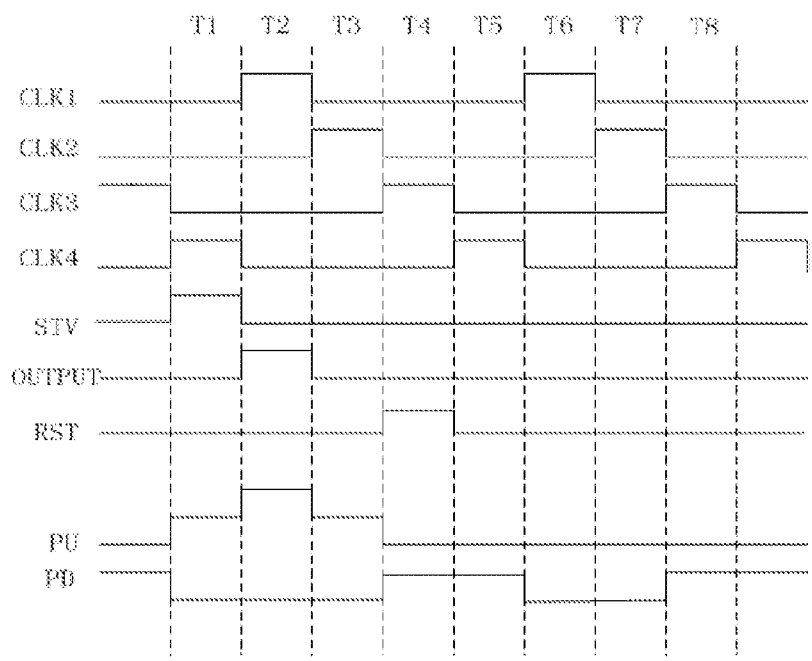
FIG. 6 is a diagram of timing sequence waveforms of signals in a shift register unit provided in the embodiments of the present disclosure when it operates.

As illustrated in FIG. 6, the first signal terminal STV=1. The first TFT M1 and the seventh TFT M7 are turned on, the first signal terminal STV pulls up the level at the pulling-up control node PU and charges the first capacitor C1 by controlling the first TFT M1. The sixth TFT M6 is turned on since the level at the pulling-up control node PU is pulled up to a high level. The level at the pulling-down control node PD is pulled down to a low level since the sixth TFT M6 and the seventh TFT M7 are turned on. The third TFT M3 is turned on when the pulling-up control node PU is at a high level, and the output terminal OUTPUT outputs a low level since the first clock signal terminal GCLK1=0. The second TFT M2 and the fourth TFT M4 are turned off since the second signal terminal RST=0, meanwhile the eighth TFT M8 is turned off since the level at the pulling-down control node PD is a low level, thus avoiding the level at the pulling-up control node PU being pulled down.

During a T2 phase, GCLK1=1, GCLK3=0, STV=0, OUTPUT=1, RST=0, PU=1, PD=0.

The T2 phase is a ON phase of the shift register unit.

As illustrated in FIG. 6, since the first signal terminal STV=0, the first TFT M1 and the seventh TFT M7 are turned off; the level at the pulling-up control node PU is further pulled up (approximating to or equal to double of the level at the node PU during the T1 phase) due to the bootstrapping effect of the first capacitor C1. The ninth TFT M9 is turned on since the first clock signal terminal GCLK1=1. The ninth TFT M9 and the sixth TFT M6 cooperate to control the pulling-down control node PD to remain at a low level and the eighth TFT M8 to be in an OFF state continuously. The second TFT M2 and the fourth TFT M4 are kept to be in an OFF state since the second signal terminal RST=0, thus avoiding the level at the pulling-up control node PU being pulled down. The third TFT M3 transmits a high level signal at the first clock signal terminal to the output terminal OUTPUT since the first clock signal terminal GCLK1=1, such that a high level signal is outputted from the output terminal OUTPUT.

During a T3 phase, GCLK1=0, GCLK3=0, STV=0, OUTPUT=0, RST=0, PU=1, PD=0.

A low level is outputted from the output terminal OUTPUT since the first clock signal terminal GCLK1=1. The level at the pulling-up control node PU is restored to the high level of the T1 phase due to the effect of the first capacitor C1, such that the pulling-down control node PD is kepted at a low level continuously.

During a T4 phase, GCLK1=0, GCLK3=1, STV=0, OUTPUT=0, RST=1, PU=0, PD=1.

The fifth TFT M5 is turned on since the third clock signal terminal GCLK3=1, such that the pulling-down control node PD is charged and the level at the pulling-down control node PD is increased. The eighth TFT M8 is turned on, such that the level at the pulling-up control node PU is pulled down. Meanwhile, the second TFT M2 and the fourth TFT M4 are turned on since the second signal terminal RST=1, such that the level at the pulling-up control node PU is pulled down to a low level by the second TFT M2, and the third TFT M3 is turned off. A low level signal is outputted from the output terminal OUTPUT continuously since the fourth TFT M4 is turned on.

It should be noted that, in the embodiments of the present disclosure, the second signal terminal RST and the third clock signal terminal GCLK3 supply high level signals simultaneously during the T4 phase, and the second signal terminal RST can also supply a high level signal during the T3 phase or a T5 phase. When the second signal terminal RST supplies a high level signal during the T3 phase, the level at the pulling-up control node PU is pulled down to a low level. The level at the pulling-down control node PD is kept to be a low level until the level at the pulling-down control node PD is pulled up to a high level when the signal at the third clock signal terminal GCLK3 is at a high level during the T4 phase. Therefore, the control on the level at the pulling-up control node PU will not be affected and the same effect as achieved by the embodiments of the present disclosure can be achieved even if the second signal terminal RST supplies a high level signal during the T3 phase. Further, when the second signal terminal RST supplies a high level during the T5 phase, since the pulling-down control node PD is charged to a high level by the third clock signal terminal GCLK3 during the T4 phase, the pulling-down control node PD controls the level at the pulling-up control node PU such that the level at the pulling-up control node PU is a low level Therefore, even if the second signal terminal RST supplies a high level signal during the T5 phase, the control on the level at the pulling-up control node PU will not be affected.

During the T5 phase, GCLK1=0, GCLK3=0, STV=0, OUTPUT=0, RST=0, PU=0, PD=1.

The fifth TFT M5 is turned off since the third clock signal terminal GCLK3=0, such that charging of the pulling-down control node PD is stopped. The second TFT M2 and the fourth TFT M4 are turned off since the second signal terminal RST=0. The seventh TFT M7 and the first TFT M1 are kept to be off since the first signal terminal STV=0, such that the pulling-up control node PU remains at a low level and thus the sixth TFT M6 is kept to be off. The ninth TFT M9 is turned off since the first clock signal terminal GCLK1=0. The fifth TFT M5, the sixth TFT M6, the seventh TFT M7 and the ninth TFT M9 are turned off, thus avoiding the level at the pulling-down control node PD being pulled down.

During a T6 phase, GCLK1=1, GCLK3=0, STV=0, OUTPUT=0, RST=0, PU=0, PD=0.

The ninth TFT M9 is turned on since the first clock signal terminal GCLK1=1, such that the level at the pulling-down control node PD is pulled down to a low level, and the level at the pulling-up control node PU and the level at the output terminal OUTPUT are kept to be low.

During a T7 phase, GCLK1=0, GCLK3=0, STV=0, OUTPUT=0, RST=0, PU=0, PD=0.

The level at the pulling-up control node PU and the level at the pulling-down control node PD are kept to be low since GCLK1=0, GCLK3=0, STV=0, RST=0.

During a T8 phase, GCLK1=0, GCLK3=1, STV=0, OUTPUT=0, RST=0, PU=0, PD=1.

The fifth TFT M5 is turned on since the third clock signal terminal GCLK3=1, such that the pulling-down control node PD is charged and the level at the pulling-down control node PD is increased. The eighth TFT M8 is turned on, such that the level at the pulling-up control node PU is kept to be low, and the output terminal OUTPUT is also kept to be at a low level.

From the above timing sequence, it can be seen that: during a period from a timing when the signal inputted from the second signal terminal RST is at a high level to a timing when the signal inputted from the first signal terminal STV is at a high level (referring to T4 phase to T7 phase in FIG. 6), the fifth TFT M5 is turned on when the third clock signal terminal GCLK3 inputs a high level (for example, during T4 phase), such that the pulling-down control node PD is charged by the signal at the third clock signal terminal GCLK3 and the level at the pulling-down control node PD is increased and is kept to be high during an adjacent subsequent phase (T5 phase); when the first clock signal terminal GCLK1 is at a high level (i.e., the T6 phase), the ninth TFT M9 controls to discharge the level at the pulling-down control node PD, such that the level at the pulling-down control node PD is pulled down to a low level and is kept to be low during a subsequent phase (the T7 phase), as a result, the voltage at the pulling-down control node PD is kept to have a duty ratio of 50%. In this way, during the period from the timing when the signal inputted from the second signal terminal RST is at a high level to the timing when the signal inputted from the first signal terminal STV is at a high level (that is, a period that between the shift register unit completes the gate driving for one row of TFTs and before a start signal of a next frame arrives at the shift register unit), a voltage having a duty ratio of 50% is applied on the second electrode (gate) of the eighth TFT M8 connected to the pulling-down control node PD, thus reducing load at the gate of the TFT, avoiding a drift of threshold voltage of the TFT, and ensuring reliability of the shift register unit.

Figure 7:
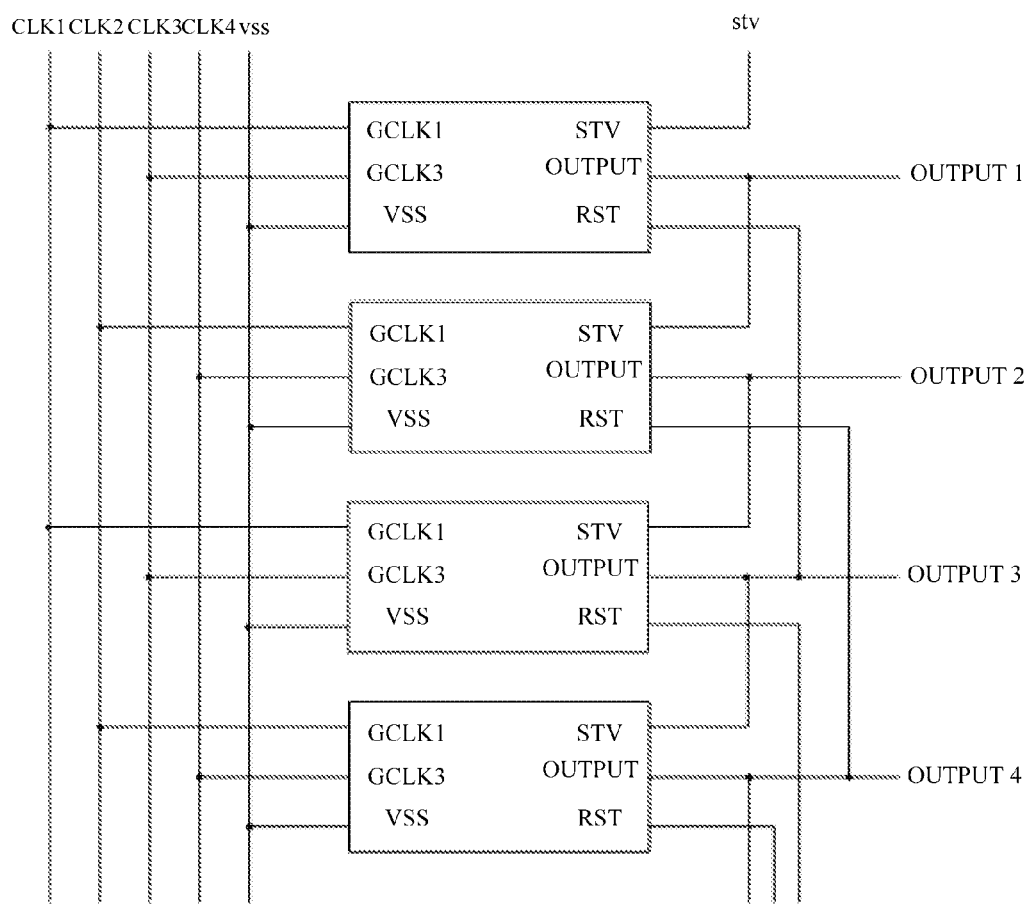
FIG. 7 is a schematic structure diagram of a gate driving circuit provided in the embodiments of the present disclosure.

In another embodiment of the present disclosure, there is provided a gate driving circuit. As illustrated in FIG. 7, the gate driving circuit comprises a plurality of stages of shift register units described above. For example, the gate driving circuit comprises N stages of shift register units in cascade. Except the shift register unit at a first stage, the first signal terminal STV(n) of each stage of the shift register units(for example, the shift register unit at an $n^{th}$ stage) is connected to the output terminal OUTPUT(n−1) of the shift register unit at its adjacent previous stage (1<n<N, n is an integer). Except the shift register unit at a last stage, the output terminal OUTPUT(n) of each stage of the shift register units is connected to the signal input terminal STV(n+1) of the shift register unit at its adjacent subsequent stage. Except the shift register units at the last two stages, the second signal terminal RST(n) of each stage of the shift register units is connected to the signal output terminal OUTPUT(n+2) of the shift register unit at a two-stage subsequent thereto.

The first clock signal terminal GCLK1 and the third clock signal terminal GCLK3 of an odd-numbered stage of shift register unit are connected to a first clock signal CLK1 and a third clock signal CLK3 respectively, and the first clock signal terminal GCLK1 and the third clock signal terminal GCLK3 of an even-numbered stage of shift register unit are connected to a second clock signal CLK2 and a fourth clock signal CLK4 respectively.

The first clock signal CLK1, the second clock signal CLK2, the third clock signal CLK3 and the fourth clock signal CLK4 are shift signals at four different phases in a clock signal cycle. There is a time delay equal to one fourth of the clock signal cycle between the first clock signal CLK1 and the second clock signal CLK2, between the second clock signal CLK2 and the third clock signal CLK3, between third clock signal CLK3 and the fourth clock signal CLK4, and between the fourth clock signal CLK4 and the first clock signal CLK1.

In the present embodiment, the first signal terminal STV (1) of the shift register unit at the first stage can input a frame start signal sty, the second signal terminals RST(N−1) and RST (N) of the shift register units at the last two stages can input a reset signal rst, and can also receive the signals at their own output terminals respectively. In addition, two redundant shift register units may be further arranged, and the output terminals of these two redundant shift register units are connected to the second signal terminals of the shift register units at the last two stages respectively, that is, OUTPUT(N+1) is connected to RST(N−1) and OUTPUT (N+2) is connected to RST(N).

In another embodiment of the present disclosure, there is provided a driving method of the gate driving circuit.

Particularly, in the driving method, during a first phase (T4 phase), the level at the pulling-down control node is controlled by the signal inputted from the third clock signal terminal and the level at the pulling-up control node; and during a second phase (T6 phase), the level at the pulling-down control node is controlled by the signal inputted from the first clock signal terminal. There is a time delay equal to half of the clock signal cycle between the first phase and the second phase (that is, between the third clock signal and the first clock signal).

In the present embodiment, the level at the pulling-down control node PD is controlled during the first phase (T4 phase) and the second phase (T6 phase), for example, during the first phase, the pulling-down control node PD is charged by the signal inputted from the third clock signal terminal, and during the second phase, the pulling-down control node PD is discharged by the pulling-down TFT under the control of the first clock signal. Here, the pulling-down TFT is used to pull down the level at the pulling-down control node. In this embodiment, it is avoided that a relative large drift is generated in the threshold voltage of the pulling-down TFT by controlling the duty ratio of the voltage at the pulling-down control node, thus effectively increasing the reliability of the shift register unit in operation.

In another aspect of the present disclosure, there is provided a display apparatus comprising the gate driving circuit provided in the above embodiment. The gate driving circuit comprises a plurality of stages of shift register units in cascade, and each stage of the shift register units comprises an input module, a pulling-up module, a first control module, a second control module, a reset module and a pulling-down module.

The display apparatus may be any display device having a display function, such as liquid crystal display panel, organic electro-luminescence light emitter, electronic paper, cell phone, television, digital photo frame, and etc.

The above descriptions are only for illustrating the embodiments of the present disclosure, and in no way limit the scope of the present disclosure. It will be obvious that those skilled in the art may make variations or alternatives to the above embodiments without departing from the spirit and scope of the present disclosure as defined by the following claims. Such variations and alternatives are intended to be included within the spirit and scope of the present disclosure.

The present application claims the priority of a Chinese application with an application No. 201410040299.3 and filed on Jan. 27, 2014, the disclosure of which is entirely incorporated herein by reference.

What is claimed is:

1. A shift register unit comprising an input module, a pulling-up module, a first control module, a second control module, a first reset module and a pulling-down module; wherein
    the input module is configured to control a level at a pulling-up control node according to a signal inputted from a first signal terminal;
    the pulling-up module is configured to control an output terminal to output a third level signal according to a signal inputted from a first clock signal terminal and the level at the pulling-up control node;
    the first control module is configured to control a level at a pulling-down control node according to a signal inputted from a third clock signal terminal and the level at the pulling-up control node;
    the second control module is configured to control the level at the pulling-down control node according to the signal inputted from the first clock signal terminal;
    the first reset module is configured to reset the level at the pulling-up control node according to the level at the pulling-down control node; and
    the pulling-down module is configured to control the output terminal to output a first level signal according to a signal inputted from a second signal terminal,
    wherein the first control module comprises a fifth TFT and a sixth TFT;
    the fifth TFT has a first electrode and a second electrode connected to the third clock signal terminal and a third electrode connected to the pulling-down control node, the sixth TFT has a first electrode connected to the pulling-down control node, a second electrode connected to the pulling-up control node, and a third electrode connected to a first voltage terminal;
    the second control module comprises a ninth TFT having a first electrode connected to the pulling-down control node, a second electrode connected to the first clock signal terminal, and a third electrode connected to the first voltage terminal;
    the signal inputted from the first clock signal terminal and the signal inputted from the third clock signal terminal have a duty ratio of ¼, and there is a time delay equal to half of a clock signal therebetween.

2. The shift register unit of claim 1, further comprising a second reset module which is configured to reset the level at the pulling-up control node according to the signal inputted from the second signal terminal.

3. The shift register unit of claim 2, wherein the second reset module comprises a second TFT having a first electrode connected to the pulling-up control node, a second electrode connected to the second signal terminal, and a third electrode connected to the first voltage terminal.

4. The shift register unit of claim 1, wherein the first control module is further configured to control the level at the pulling-down control node according to the signal inputted from the first signal terminal.

5. The shift register unit of claim 4, wherein the first control module further comprises a seventh TFT having a first electrode connected to the pulling-down control node, a second electrode connected to the first signal terminal, and a third electrode connected to the first voltage terminal.

6. The shift register unit of claim 1, wherein the input module comprises a first thin film transistor TFT having a first electrode and a second electrode connected to the first signal terminal and a third electrode connected to the pulling-up control node.

7. The shift register unit of claim 1, wherein the pulling-up module comprises a third TFT and a first capacitor,
    the third TFT has a first electrode connected to the first clock signal terminal, a second electrode connected to the pulling-up control node, and a third electrode connected to the output terminal; and
    the first capacitor has a first terminal connected to the pulling-up control node and a second terminal connected to the output terminal.

8. The shift register unit of claim 1, wherein the first reset module comprises an eighth TFT having a first electrode connected to the pulling-up control node, a second electrode connected to the pulling-down control node, and a third electrode connected to the first voltage terminal.

9. The shift register unit of claim 1, wherein the pulling-down module comprises a fourth TFT having a first electrode connected to the output terminal, a second electrode connected to the second signal terminal, and a third electrode connected to the first voltage terminal.

10. A gate driving circuit comprising a plurality of stages of shift register unit of claim 1, wherein
    the first clock signal terminal and the third clock signal terminal of an odd-numbered stage of shift register unit are connected to a first clock signal and a third clock signal respectively, and the first clock signal terminal and the third clock signal terminal of an even-numbered stage of shift register unit are connected to a second clock signal and a fourth clock signal respectively;

the first clock signal, the second clock signal, the third clock signal and the fourth clock signal are shift signals outputted sequentially, and there is a time delay equal to half of a clock signal cycle between the second clock signal and the fourth clock signal.

11. A driving method for the gate driving circuit of claim 10, wherein during a first phase, the level at the pulling-down control node is controlled by the signal inputted from the third clock signal terminal and the level at the pulling-up control node; and during a second phase, the level at the pulling-down control node is controlled by the signal inputted from the first clock signal terminal.

12. The gate driving circuit of claim 10, wherein each stage of shift register unit further comprises a second reset module which is configured to reset the level at the pulling-up control node according to the signal inputted from the second input signal terminal;

wherein the second control module comprises a ninth TFT having a first electrode connected to the pulling-down control node, a second electrode connected to the first clock signal terminal, and a third electrode connected to the first voltage terminal.

13. The gate driving circuit of claim 10, wherein the input module comprises a first thin film transistor TFT having a first electrode and a second electrode connected to the first signal terminal and a third electrode connected to the pulling-up control node;

the pulling-up module comprises a third TFT and a first capacitor; wherein the third TFT has a first electrode connected to the first clock signal terminal, a second electrode connected to the pulling-up control node, and a third electrode connected to the output terminal; the first capacitor has a first terminal connected to the pulling-up control node and a second terminal connected to the output terminal.

14. The gate driving circuit of claim 10, wherein the first reset module comprises an eighth TFT having a first electrode connected to the pulling-up control node, a second electrode connected to the pulling-down control node, and a third electrode connected to the first voltage terminal; and the pulling-down module comprises a fourth TFT having a first electrode connected to the output terminal, a second electrode connected to the second signal terminal, and a third electrode connected to the first voltage terminal.

15. The gate driving circuit of claim 10, wherein the first control module is further configured to control the level at the pulling-down control node according to the signal inputted from the first signal terminal; and the first control module further comprises a seventh TFT having a first electrode connected to the pulling-down control node, a second electrode connected to the first signal terminal, and a third electrode connected to the first voltage terminal.

* * * * *